United States Patent
Veroni

(10) Patent No.: US 10,048,308 B2
(45) Date of Patent: Aug. 14, 2018

(54) ELECTRICITY METER WITH FAULT DETECTION MECHANISM AND FAULT DETECTION METHOD

(71) Applicant: ENEL DISTRIBUZIONE S.P.A., Rome (IT)

(72) Inventor: Fabio Veroni, Vimercate-Milan (IT)

(73) Assignee: ENEL DISTRIBUZIONE S.P.A., Rome (IT)

( * ) Notice: Subject to any disclaimer, the term of this patent is extended or adjusted under 35 U.S.C. 154(b) by 108 days.

(21) Appl. No.: 15/037,076

(22) PCT Filed: Nov. 18, 2013

(86) PCT No.: PCT/EP2013/074045
§ 371 (c)(1),
(2) Date: May 17, 2016

(87) PCT Pub. No.: WO2015/070927
PCT Pub. Date: May 21, 2015

(65) Prior Publication Data
US 2016/0282399 A1 Sep. 29, 2016

(51) Int. Cl.
*G01R 31/06* (2006.01)
*G01R 31/02* (2006.01)
(Continued)

(52) U.S. Cl.
CPC ......... *G01R 31/027* (2013.01); *G01R 15/185* (2013.01); *G01R 21/133* (2013.01);
(Continued)

(58) Field of Classification Search
CPC .... G01R 15/183; G01R 15/185; G01R 19/20; G01R 21/133; G01R 22/061; G01R 22/066; G01R 31/027; G01R 35/04; H02M 1/40
(Continued)

(56) References Cited

U.S. PATENT DOCUMENTS 2,410,386 A 10/1946 Miller
4,280,162 A * 7/1981 Tanka .................... H02H 3/332
324/117 R
(Continued)

FOREIGN PATENT DOCUMENTS

DE 23 00 802 7/1974
DE 35 40 777 5/1987
(Continued)

OTHER PUBLICATIONS

International Search Report for PCT/EP2013/074045 dated Aug. 7, 2014, 5 pages.
(Continued)

*Primary Examiner* — Arleen M Vazquez
*Assistant Examiner* — Steven Yeninas
(74) *Attorney, Agent, or Firm* — Nixon & Vanderhye P.C.

(57) ABSTRACT

An electricity meter for metering an amount of energy in accordance with a primary AC current and an AC supply voltage. The electricity meter comprises a current transformer comprising the primary conductor, a secondary winding, an auxiliary winding, and a magnetic core arranged to be magnetically coupled with the three windings. The electricity meter further comprises a circuit configured to provide the auxiliary winding with a test signal modulated in accordance with at least one of a first and a second modulation state. The test signal has the same frequency as the AC supply voltage. The electricity meter further comprises an electrical energy consumption measurement unit, coupled to the secondary winding, and being configured to provide a first test value as a function of a secondary current flowing through the secondary winding when the test signal is in a first modulation state, to provide a second test value as a function of a secondary current flowing through the secondary winding when the test signal is in a second modulation
(Continued)

state, and to determine, on the basis of the first and second test values, whether a measurement fault warning signal is to be generated.

25 Claims, 7 Drawing Sheets

(51) Int. Cl.
*G01R 35/04* (2006.01)
*G01R 15/18* (2006.01)
*G01R 21/133* (2006.01)
*G01R 22/06* (2006.01)

(52) U.S. Cl.
CPC ......... *G01R 22/061* (2013.01); *G01R 22/066* (2013.01); *G01R 35/04* (2013.01)

(58) Field of Classification Search
USPC ...... 324/74, 110, 117 R, 127, 247, 253, 255, 324/726
See application file for complete search history.

(56) References Cited

U.S. PATENT DOCUMENTS

| | | | |
|---|---|---|---|
| 4,843,310 A | 6/1989 | Friedl | |
| 4,901,008 A | 2/1990 | Quastel et al. | |
| 8,421,475 B2* | 4/2013 | Thiim | G01R 31/025 324/117 H |
| 2006/0158798 A1* | 7/2006 | Jackson | H02H 3/334 361/42 |
| 2010/0164501 A1 | 7/2010 | Grimm | |
| 2012/0078555 A1* | 3/2012 | Banhegyesi | G01D 4/004 702/64 |
| 2012/0105052 A1* | 5/2012 | Niemann | G01R 15/181 324/127 |
| 2012/0319473 A1* | 12/2012 | Tzivanopoulos | G01R 15/183 307/10.1 |
| 2014/0218012 A1* | 8/2014 | Umetani | G01R 33/1215 324/117 R |

FOREIGN PATENT DOCUMENTS

| | | |
|---|---|---|
| DE | 38 22 051 | 1/1990 |
| DE | 39 40 932 | 6/1991 |
| DE | 41 28 989 | 3/1993 |
| ES | 2 103 173 | 8/1997 |
| GB | 2 232 493 | 12/1990 |
| GB | 2 391 948 | 2/2004 |
| GB | 2 409 528 | 6/2005 |

OTHER PUBLICATIONS

Written Opinion of the ISA for PCT/EP2013/074045 dated Aug. 7, 2014, 7 pages.
Written Opinion of the IPEA for PCT/EP2013/074045 dated Nov. 25, 2015, 7 pages.
International Preliminary Report on Patentability for PCT/EP2013/074045 dated Mar. 3, 2016, 7 pages.

* cited by examiner

ELECTRICITY METER WITH FAULT DETECTION MECHANISM AND FAULT DETECTION METHOD

This application is the U.S. national phase of International Application No. PCT/EP2013/074045 filed 18 Nov. 2013 which designated the U.S., the entire content of which is hereby incorporated by reference.

TECHNICAL FIELD

The present application relates to an electricity meter having a fault detection mechanism and to a fault detection method.

BACKGROUND

Electricity meters are used to meter the amount of electrical energy that a consumer withdraws from an electrical energy distribution grid. Typically, electricity meters include a current transformer which comprises a conductor (referred to as "primary conductor" in the following), a winding (referred to as "secondary winding" in the following) and a magnetic core which magnetically couples with the conductor and the winding.

For the purpose of metering the amount of withdrawn energy, the AC load current supplied to the consumer is fed through the primary conductor. Due to the magnetic coupling between the primary conductor and the secondary winding, the secondary winding yields an output in accordance with the AC load current flowing through the primary conductor. On the basis of this output, the energy withdrawn by the consumer may be determined.

In case, however, a DC magnetic field is provided in the vicinity of the electricity meter, the metering accuracy of the electricity meter may be compromised. Current transformers in electricity meters are used and sized to work in the linear region. The presence of an external DC magnetic field can add an offset which pushes the working point of the current transformer into the saturation region. As a consequence, the current flowing in the secondary winding is no longer a suitable representation of the load current supplied to the consumer. For this reason, the energy amount determined on the basis of the current flowing through the secondary winding may be incorrect. A solution is needed to reliably detect the occurrence of such a fault.

SUMMARY

According to an embodiment described herein, an electricity meter is provided for metering an amount of energy in accordance with a primary AC current and an AC supply voltage provided by an electrical distribution grid. The AC supply voltage of the electrical distribution grid has a given AC voltage frequency and the primary AC current is fed through a primary conductor. The electricity meter comprises a current transformer which comprises the primary conductor, a secondary winding, an auxiliary winding, and a magnetic core arranged to be magnetically coupled with the primary conductor, the secondary winding and the auxiliary winding. The electricity meter further comprises a circuit which is configured to provide the auxiliary winding with a test signal modulated in accordance with at least one of a first and a second modulation state, the test signal having the same frequency as the AC supply voltage. The electricity meter further comprises an electrical energy consumption measurement unit which is coupled to the secondary winding and configured to provide a first test value as a function of a secondary current flowing through the secondary winding when the test signal is in a first modulation state. The energy consumption measurement unit is further configured to provide a second test value as a function of a secondary current flowing through the secondary winding when the test signal is in a second modulation state, and determine, on the basis of the first and second test values, whether a measurement fault warning signal is to be generated.

According to a further embodiment described herein, a method is provided for detecting a fault in an electricity meter for metering an amount of energy in accordance with a primary AC current and an AC supply voltage provided by an electrical distribution grid. The AC supply voltage of the electrical distribution grid has a given AC voltage frequency and the primary AC current flows through a primary conductor. The electricity meter comprises a current transformer which comprises the primary conductor, a secondary winding, an auxiliary winding, and a magnetic core arranged to be magnetically coupled with the primary conductor, the secondary winding and the auxiliary winding. The electricity meter further comprises a circuit which is configured to provide the auxiliary winding with a test signal modulated in accordance with at least one of a first and a second modulation state, the test signal having the same frequency as the AC supply voltage. The method comprises the step of providing a first test value as a function of a secondary current flowing through the secondary winding when the test signal is in the first modulation state. The method further comprises the step of providing a second test value as a function of a secondary current flowing through the secondary winding when the test signal is in the second modulation state. The method further comprises the step of determining, on the basis of the first and second test values, whether a measurement fault warning signal is to be generated.

According to these embodiments, the test signal has the same frequency as the AC supply voltage frequency of the power distribution grid. According to advantageous but non-limiting exemplary embodiments, the test signal can be generated easily by deriving it from the AC supply voltage itself.

DETAILED DESCRIPTION

First, an embodiment of an electricity meter will be described with reference to FIG. 1.

Figure 1:
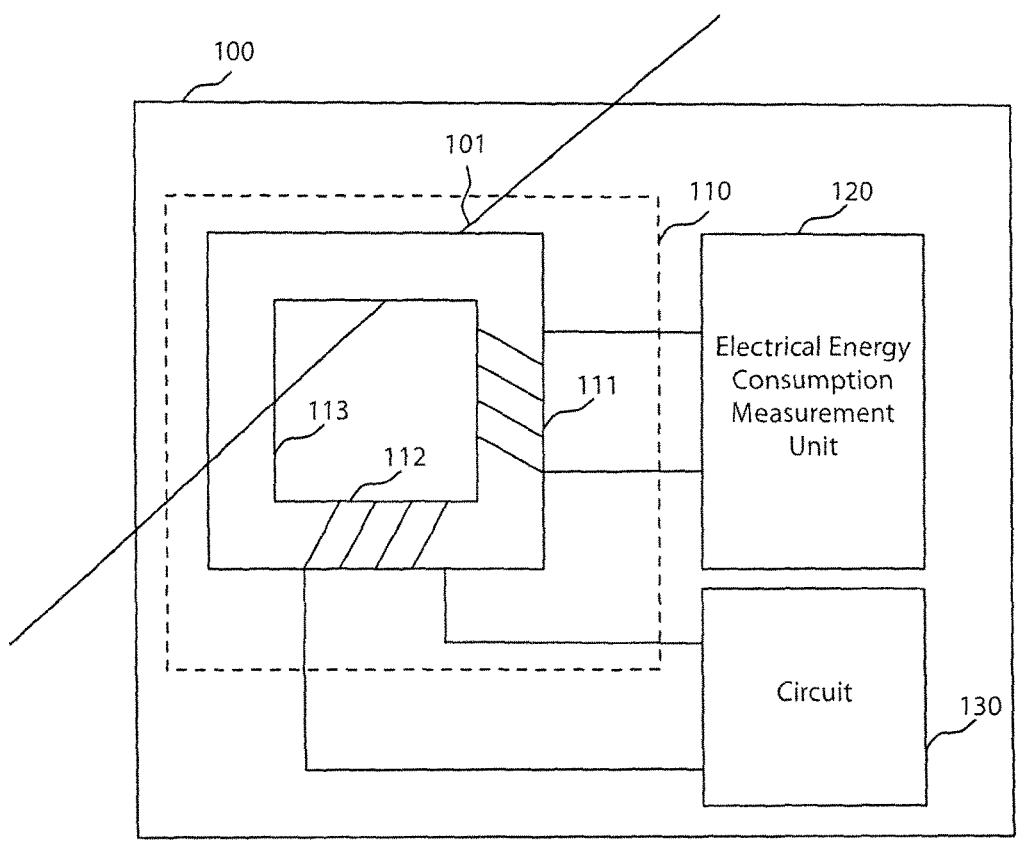
FIG. 1 illustrates a schematic block diagram of an embodiment of an electricity meter.

The electricity meter 100 shown in FIG. 1 includes a current transformer 110, which comprises a primary conductor 101, a secondary winding 111, an auxiliary winding 112, and a magnetic core 113. The magnetic core 113 is arranged to be magnetically coupled with the primary conductor 101, the secondary winding 111 and the auxiliary winding 112.

The electricity meter 100 further comprises a circuit 130 which is electrically coupled to the auxiliary winding 112 and configured to provide the auxiliary winding 112 with a test signal $V_{Test}$. The test signal $V_{Test}$ may be modulated to be in at least one of a first and a second modulation state. That is, the circuit may provide the test signal $V_{Test}$ in the first or in the second modulation state. Non-limiting examples of modulating the test signal include modulating the amplitude or the phase of the test signal. It is noted that the test signal $V_{Test}$ is not limited to a voltage signal, but may be any other electrical signal, such as a current signal.

The electricity meter 100 further comprises an electrical energy consumption measurement unit 120, which is electrically coupled to the secondary winding 111. The electrical energy consumption measurement unit 120 is configured to determine an energy amount based on the current flowing through the secondary winding 111 (this current is referred to as "secondary current" in the following).

The electrical energy consumption measurement unit 120 is further configured to determine test values when the test signal is in the first or second modulation state. According to a preferable but non-limiting embodiment, the test values are obtained using the energy consumption measurements performed by the energy consumption measurement unit anyway present in the electricity meter. The test values are a function of the secondary current flowing through the secondary winding. They may represent an electrical measure supplied by the secondary winding to a measurement circuit. Suitable examples of electrical measures are at least one of voltage, current, active power, reactive power, energy. Alternatively or additionally, the test values may represent an electrical measure like electrical energy or active and/or reactive power that is obtained for example by multiplying the current or voltage supplied by the secondary winding by the AC supply voltage and averaging or integrating the product over time as appropriate. The person skilled in the art will appreciate that various electrical measures are suitable for obtaining the test values and the present invention is not limited to using any particular electrical measure. Many different ways of representing the output of the secondary winding are conceivable—the output may be represented by energy values, power values, voltage values, current values or any other values which are a function of the secondary current.

The electrical energy consumption measurement unit 120 is further configured to determine, on the basis of the test values, whether a measurement fault warning signal is to be generated. This determination is based on at least two test values which are determined in accordance with at least two different modulation states of the test signal. In other words, for determining the different test values the test signal takes different modulation states. As a non-limiting example the amplitude of the test signal is modulated, a first test value is determined when the amplitude of the test signal has a first level, and a second test value is determined when the amplitude of the test signal has a second level different from the first level. As another non-limiting example the phase of the test signal is modulated, a first test value is determined when the phase of the test signal takes a first phase value and a second test value is determined when the phase of the test signal takes a second phase value different from the first phase value.

In the following, a non-limiting example of the operation of the electricity meter will be given.

In operation, i.e. when the electricity meter is coupled to an electrical distribution grid and meters the amount of energy provided by the electrical distribution grid to a consumer, the AC load current (also referred to as primary AC current in the following) which the consumer withdraws from the electrical distribution grid, is fed through the primary conductor 101. Due to the magnetic coupling between the primary conductor 100 and the secondary winding 111, the secondary current flowing through the secondary winding 111 is a function of the primary AC current.

In one embodiment, the electrical energy consumption measurement unit may meter a power or energy amount provided to the consumer on the basis of the secondary current and the AC supply voltage of the electrical distribution grid. This metering of a power or energy amount may be conducted in a manner well known per se. In accordance with a further embodiment, the electricity meter may be configured such that the AC supply voltage is provided to the electrical energy consumption measurement unit. Alternatively or additionally, the electricity meter may be configured such that a signal derived from the AC supply voltage is provided to the electrical energy consumption measurement unit. An example of such a derived signal may be a signal obtained from a voltage divider connected to the AC supply voltage. Another example of such a derived signal may be a signal which varies in accordance with the phase of the AC supply voltage.

Next, the fault detection functionality of the electricity meter will be described in detail.

As mentioned in the introductory section, the correct determination or measurement of the energy amount supplied to the consumer may be compromised by a saturation of the magnetic core 113 caused by the application of an external DC magnetic field. In case such saturation of the magnetic core 113 is present, the secondary current is no longer a suitable representation of the primary AC current. As a result, the energy amount determined by the electrical energy consumption measurement unit 120 does not represent the actual amount of energy withdrawn by the consumer.

In accordance with the present invention, such fault may be detected by means of the circuit 130, the auxiliary winding 112 and the energy consumption measurement unit 120. The auxiliary winding 112 is magnetically coupled to the secondary winding 112 via the magnetic core 113. Therefore, the secondary current is a function of the current flowing through the auxiliary winding (this current is referred to as "test current" in the following). The relationship between the test current and the secondary current is a function of the working point of the magnetic core 113. That is, when the above mentioned fault of a saturated magnetic core 113 occurs, the relationship between the test current and the secondary current is different from the relationship between the test current and the secondary current when the magnetic core 113 is operated in its linear region. By providing a predetermined test signal to the auxiliary winding 112 and assessing the resultant output of the secondary winding, it may thus be determined whether the magnetic core 113 is saturated; i.e. whether a fault has occurred.

As an advantage of this approach of coupling the test signal into the system via the auxiliary winding, one does not have to modify the primary conductor. Moreover, as a further advantage, if the energy consumption measurement unit is used for determining the first and second test values, the described fault detection mechanism may be implemented in a cost effective manner, since an energy consumption measurement unit is already present in a conventional electricity meter and is able to determine power or energy amounts, which may be used as test values.

It is noted that, while a conventional energy consumption measurement unit is not configured to determine whether a measurement fault warning signal is to be generated on the basis of first and second test values, this functionality may be added by adapting the conventional energy consumption measurement unit. Such adaption may be performed in many different ways. If, for example, the energy consumption measurement unit comprises a programmable chip, the software of the chip may be adapted to realize the described determination whether a measurement fault warning signal is to be generated. As an alternative, a further chip or further circuitry may be added to the conventional energy consumption measurement unit, or another chip of the electricity meter may be reprogrammed to realize this functionality. It is to be understood that such additional hardware does not necessarily need to be physically integrated with the conventional energy consumption measurement unit in order to implement the energy consumption measurement unit as described herein. That is, the described energy consumption measurement unit is not limited to a single physical entity but may also be realized by a group of different physical entities such as a group of chips, etc. Of course, the energy consumption measurement unit may also be realized by a group of software modules.

The electrical energy consumption measurement unit 120 is configured to provide two test values in accordance with two different modulation states of the test signal. For this reason, the determination of whether a measurement fault warning signal is to be generated may be based on a differential assessment of the test values. That is, it may be assessed how the output of the secondary winding changes from one modulation state of the test signal to the other. This has the advantage that the presence of a primary AC current may be compensated. If the same primary AC current is present during both the determination of the first and second test values, the contribution of this primary AC current is the same to both the first and the second value. The contribution of the primary AC current can thus be easily cancelled out by e.g. basing the determination of whether the measurement fault warning signal is to be generated on the difference between the first and second test values. Alternatively or additionally, a degree of correlation of the test values and the modulation state of the test signal to each other over time can be used as a basis for determining whether a measurement fault warning signal should be generated.

In the following, the test signal $V_{test}$ will be described in more detail with reference to the examples shown in FIGS. 2a and 2b. Generally, the circuit 130 is configured to provide the test signal in a first and a second modulation state. In accordance with an embodiment, the first modulation state may differ from the second modulation state in at least one of amplitude and phase of the test signal.

Figure 2A:
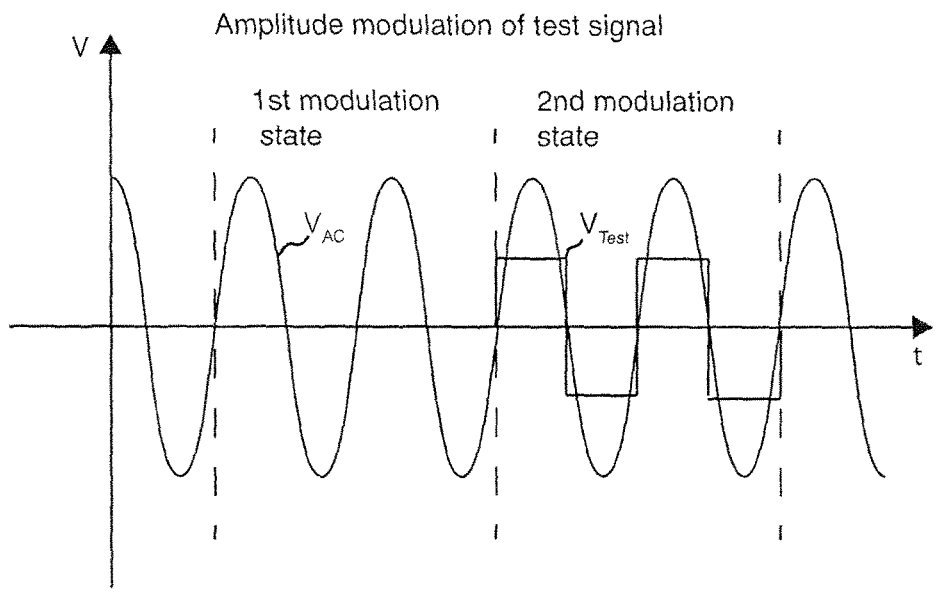
FIG. 2a illustrates an amplitude modulation of a test signal having a square waveform.

FIG. 2a illustrates an example of a test signal being provided in two modulation states having different amplitudes. As may be gathered from FIG. 2a, the amplitude of the test signal in the first modulation state may be zero, while the amplitude of the test signal in the second modulation state may be greater than zero. As may further be gathered from FIG. 2a, the frequency of the test signal may be equal to the frequency of the AC supply voltage. Of course, instead of applying a full on/full off modulation as shown in this non-limiting example, other modulation levels for the different modulation states can be used as well.

Figure 2B:
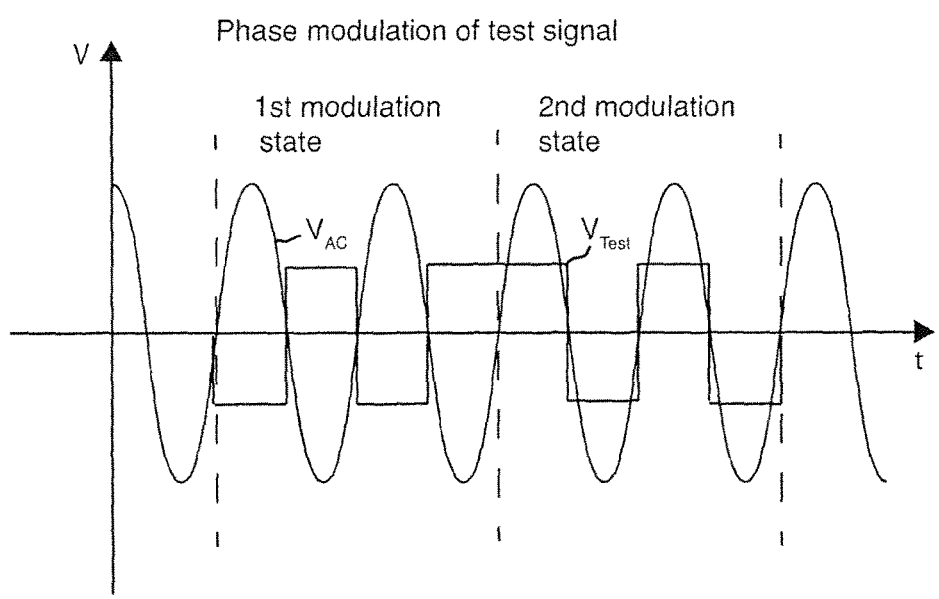
FIG. 2b illustrates a phase modulation of a test signal having a square waveform.

FIG. 2b illustrates an example of a test signal being provided in two modulation states having different phases. As may be gathered from FIG. 2b, the phase of the first modulation state may be shifted relative to the phase of the test signal in the second modulation state. In the example of FIG. 2b, the phase is shifted by an amount of 180°. As may further be gathered from FIG. 2a, the frequency of the test signal may be equal to the frequency of the AC supply voltage. Of course, the present invention is not limited to a phase shift amount of 180°. It is readily apparent that other phase shift amounts than 180° can be used as well.

It is noted that, even though the test signal is shown as a square wave in these examples, the test signal is not limited to a particular waveform. The test signal may also be provided in any other suitable waveform such as a sine waveform, rectangular waveform or triangular waveform.

Moreover, even though the examples show that the first modulation state is directly followed by the second modulation state, one modulation state does not necessarily need to be followed directly by another modulation state. Instead there may for example be an extended time period between modulation states in which no test signal or no modulation of the test signal is provided.

According to a further embodiment, the phase of the test signal may be set relative to the phase of the AC supply voltage. As shown in FIG. 2a, the test signal may be provided with the same phase as the AC supply voltage. The test signal may also be provided with a phase shift relative to the phase of the AC supply voltage.

In the following, examples of how the circuit provides the test signal will be described.

In accordance with an embodiment, the test signal may be based directly on the AC supply voltage of the electrical distribution grid. That is, when the electricity meter is in operation and connected to the AC supply voltage, the test signal may be based on an electrical signal branched off the AC supply voltage, for example by means of a voltage divider. The circuit may be configured to receive the electrical signal and may further be configured to adapt at least one of the amplitude and phase of the electrical signal for providing the test signal in the respective modulation states. In other words, according to this embodiment, the circuit may be configured to adapt at least one of the amplitude and phase of the AC grid voltage and provide the adapted AC grid voltage as the test signal.

As a benefit of this approach, the test signal may be generated in a simple and cost efficient manner. That is, in accordance with this embodiment, it is not necessary to provide a complex and expensive function generator for generating the test signal. Instead, as elaborated in more detail below, for adapting the amplitude or phase of the AC supply voltage in order to provide the test signal, simple and inexpensive circuitry may be used.

In one embodiment, the circuit comprises a switch which is connected to the auxiliary winding. When the switch is open, no electrical signal will be provided to the auxiliary winding. This state is equivalent to the modulation state in which the amplitude of the test signal is zero. When the switch is closed, the test signal may be provided in the modulation state in which the amplitude is larger than zero. In one embodiment, the electrical signal is the adapted AC supply voltage.

In accordance with a further embodiment, the circuit comprises means for setting the amplitude of the electrical signal. The circuit may e.g. comprise a variable resistor for this purpose. The electrical signal may e.g. be the AC supply voltage, when the electricity meter is in operation and connected to the AC supply voltage.

In accordance with a further embodiment, the circuit comprises means for adapting the phase of the electrical signal. The electrical signal may e.g. be the AC supply voltage. This functionality may be realized by a variable resistor. The circuit may additionally or alternatively comprise passive components such as inductors, capacitors and resistors. The passive components may be arranged to form an RL circuit or an RLC circuit together with the auxiliary winding, such that the phase of the test signal relative to the phase of the AC supply voltage may be set to a predetermined value.

In accordance with an embodiment, the circuit is connected between the AC supply voltage and the auxiliary winding and comprises a switch and passive electrical components, such as the resistors, inductors and capacitors mentioned above. In accordance with yet another embodiment, the circuit consists of a switch and passive electrical components.

Next, examples of the determination of the first and second test values will be described.

According to a further embodiment, the electricity meter 100 comprises a control unit 150 configured to provide a control signal for the circuit. The circuit may be configured to control the modulation state of the test signal in accordance with the control signal. In one embodiment, the circuit may comprise a switch as described above and the control signal may control the switch.

In accordance with a further embodiment, the control unit 150 may be configured to provide the control signal also to the electrical consumption measurement unit 120 and the determination of the first and second test values may be based on the control signal. In particular, the electrical energy measurement unit may set a first and a second test interval on the basis of the control signal and may determine the first test value on the basis of the secondary current flowing in the first test interval, and may determine the second test value on the basis of the secondary current flowing in the second test interval.

It is noted that a test value may be based on a single current value within a test interval, such as a peak amplitude. That is, a test value may be a single current value, voltage value or power value based on a peak value of the secondary current flowing during the respective test interval. A test value may also be based on an integration over the entire test interval. That is, a test value may e.g. be provided as an energy value or averaged power value obtained by integrating the product of the secondary current and the AC supply voltage over the entire test interval. The first and second test values may thus be power or energy values determined on the basis of the secondary current and the AC supply voltage.

Moreover, the electrical energy measurement unit 120 may be configured to generate a pulse signal, the pulse frequency of which being indicative of at least one of active power and reactive power determined as a function of the secondary current and the AC supply voltage. The first and second test values may then be determined as time intervals between pulses of a pulse signal. As the first test value, a first time interval between a first pair of pulses may be provided and, as the second test value, a second time interval between a second pair of pulses may be provided. In one embodiment, the test values may be based on time intervals between successive pulses. In this manner, the minimum possible time interval is chosen as the basis of the test intervals. This minimizes the probability that the primary AC current changes during determination of the test values. This approach is advantageous since the accuracy of the fault detection functionality may be compromised if the primary AC current changes while one of the test values is determined, or changes in between the determination of the first and second test values. In order to further reduce this risk that the primary AC current changes between measurements the second time interval may directly precede or follow the first time interval.

Another approach of mitigating the influence of the primary AC current may consist in averaging out the contributions of the primary AC current by determining the test values on the basis of the secondary current flowing over a large time period. In one embodiment, the electrical energy consumption measurement unit 120 may provide a pulse signal, as described above, and the test values may be determined as numbers of pulses registered during respective accumulation time intervals. In order to average out contributions of the primary AC current, these accumulation time intervals may be chosen to be 24 hours or longer.

In order to further reduce the risk of the primary AC current affecting the fault detection functionality, the measurement unit may comprise an acquisition unit, configured to acquire a power consumption over time profile, and the measurement unit may be configured to set the length of the first and second accumulation time intervals on the basis of the acquired power consumption over time profile. It may thus be determined, how long the accumulation time intervals have to be in order to sufficiently average out the influences of the first primary AC current on the secondary current. Based on this determination, the accumulation time intervals may be set.

In accordance with another embodiment, the risk of the primary AC current affecting the fault detection functionality may be reduced by setting the first and second test intervals to predetermined times of day. That is, the test intervals may e.g. be set to times after midnight or early in the morning, when it is most likely that the load current withdrawn by the consumer remains relatively constant. In accordance with a further embodiment, the times of day may be determined on the basis of an acquired power consumption over time profile.

In the following, embodiments of particularly beneficial combinations of providing the test signal and determining the test values will be described.

In accordance with one embodiment of the present invention, the first and second values are energy detection values indicative of an amount of energy due to active power. The energy detection values are determined on the basis of the secondary current and the AC supply voltage. Moreover, in accordance with this embodiment, the amplitude of the test signal is zero in the first modulation state and larger than zero in the second modulation state. Furthermore, the phase shift between the test signal in the second modulation state and the AC supply voltage is 90°. In one exemplary embodiment, the test signal is a current signal.

The amplitude of the test signal in the first modulation state is zero. Therefore, when the test signal is in the first modulation state, it does not influence the secondary current and thus will not affect the energy metering operation of the electricity meter. Moreover, when the test signal is in the second modulation state, its phase is shifted by 90° with regard to the AC supply voltage. If the current transformer operates normally, the secondary current induced by the test signal has the same phase shift with regard to the AC supply voltage as the test signal. As such, the determination of an energy detection value indicative of active power based on the secondary current and the AC supply voltage is not affected by the test signal in the second modulation state. Due to the phase shift of 90°, the secondary current induced by the test signal only influences the determination of reactive power.

In case the magnetic core of the current transformer is saturated, the phase of the secondary current induced by the test signal changes. In particular, in case the transformer is saturated, the secondary current may have a phase shift of approximately 90° relative to the phase of the test signal, resulting in a phase shift of approximately 180° between the secondary current and the AC supply voltage. The secondary current induced by the test signal therefore influences the amount of active power determined by the electrical energy consumption measurement unit. In particular, due to the phase shift of approximately 180°, the amount of active power may decrease when switching from the first to the second modulation state.

Therefore, if the second test value deviates from the first test value by more than a predetermined threshold, and, in particular, if the second test value is smaller than the first test value, it may be assumed that the transformer is saturated and a measurement fault warning signal may be generated.

This embodiment is particularly advantageous for electricity meters which meter energy indicative of active power. Since the provision of the test signal does not affect the determination of active power as long as the current transformer is operating normally, the described fault detection mechanism does not distort the normal energy metering operation.

According to a further embodiment, the circuit is configured to provide the test signal such that the phase of the test signal in the first modulation state is shifted by 180° relative to the phase of the test signal in the second modulation state. Moreover, the phase of the test signal may set to be equal to the phase of the AC supply voltage, and the amplitude of the test signal in the first modulation state may be set equal to the amplitude of the test signal in the second modulation state. Moreover, the first test interval may be set to be of equal length as the second test interval. The test signal shown in FIG. 2b is an example of this configuration. In accordance with this configuration, if the electricity meter measures the amount of withdrawn energy on the basis of active power based on the secondary current and the AC supply voltage, the advantage is attained that the provision of the test signal does not have a net influence on the energy measurement. That is, the contributions of the additional secondary current induced by the test signal in the first and second modulation states cancel each other out such that the net contribution is zero.

In the following, examples will be provided of how it may be determined whether the measurement fault warning signal is to be generated.

As discussed above, the determination of whether the measurement fault warning signal is to be generated is based on the first and second test values. In accordance with one embodiment, the difference between the first and second test values may be compared to a predetermined threshold for performing the determination. The predetermined threshold may be recorded in advance and may be set in between the difference between the first and second test values obtained when the magnetic core operates in the linear region and the difference between the first and second test values obtained when the magnetic core operates in the saturated region. In accordance with another embodiment, it may be assessed whether the difference between the first and second test values falls within a predetermined first range. This first range may represent a range of differences between the first and second test values caused by the test signal under normal operating conditions of the electricity meter. The range may be recorded in advance and may be stored in a memory of the electricity meter.

In accordance with an embodiment, the determination of whether the measurement fault warning signal is to be generated may be based on a correlation between a signal that varies in accordance with the modulation state of the test signal and on a set formed of the first and second test values. That is, a set may be formed out of the first and second values and this set may be correlated with a signal that varies in accordance with the modulation state of the test signal. An example of such signal is the above described control signal. In a preferred embodiment, the test signal may be provided in the first and second modulation states multiple times and the first and second test values may be determined multiple times, such that the correlation may be performed over a larger number of values. The resultant correlation value may then be compared to a predetermined threshold in order to determine whether the measurement fault warning signal is to be generated.

In the following, examples will be provided of how the measurement fault warning signal may be processed.

In accordance with one embodiment, the electrical energy consumption measurement unit is configured to generate a measurement fault indication signal in response to the generated measurement fault warning signal. That is, the measurement fault warning signal may not directly indicate a measurement fault. This approach is advantageous in cases where a single measurement fault warning signal may be caused by a change of the primary AC current and not by a saturated magnetic core.

In accordance with a further embodiment, the measurement unit 120 is configured to generate the measurement fault indication signal if a predetermined number of successive determinations of whether the measurement fault warning signal is to be generated have resulted in the determination that the fault warning signal is to be generated. That is, the measurement fault indication signal is only generated if a predetermined number of successive determinations result in the generation of the measurement fault warning signal.

In accordance with a further embodiment, the electrical energy consumption measurement unit 120 is configured to generate the measurement fault indication signal if, within a predetermined time interval, a predetermined number of determinations of whether the fault warning signal is to be generated have resulted in the determination that the fault warning signal is to be generated.

In accordance with a further embodiment, the electrical energy consumption measurement unit 120 is configured to generate the measurement fault indication signal if, among a first predetermined number of determinations of whether the fault warning signal is to be generated, a second predetermined number of the determinations have resulted in the determination that the fault warning signal is to be generated.

Figure 3:
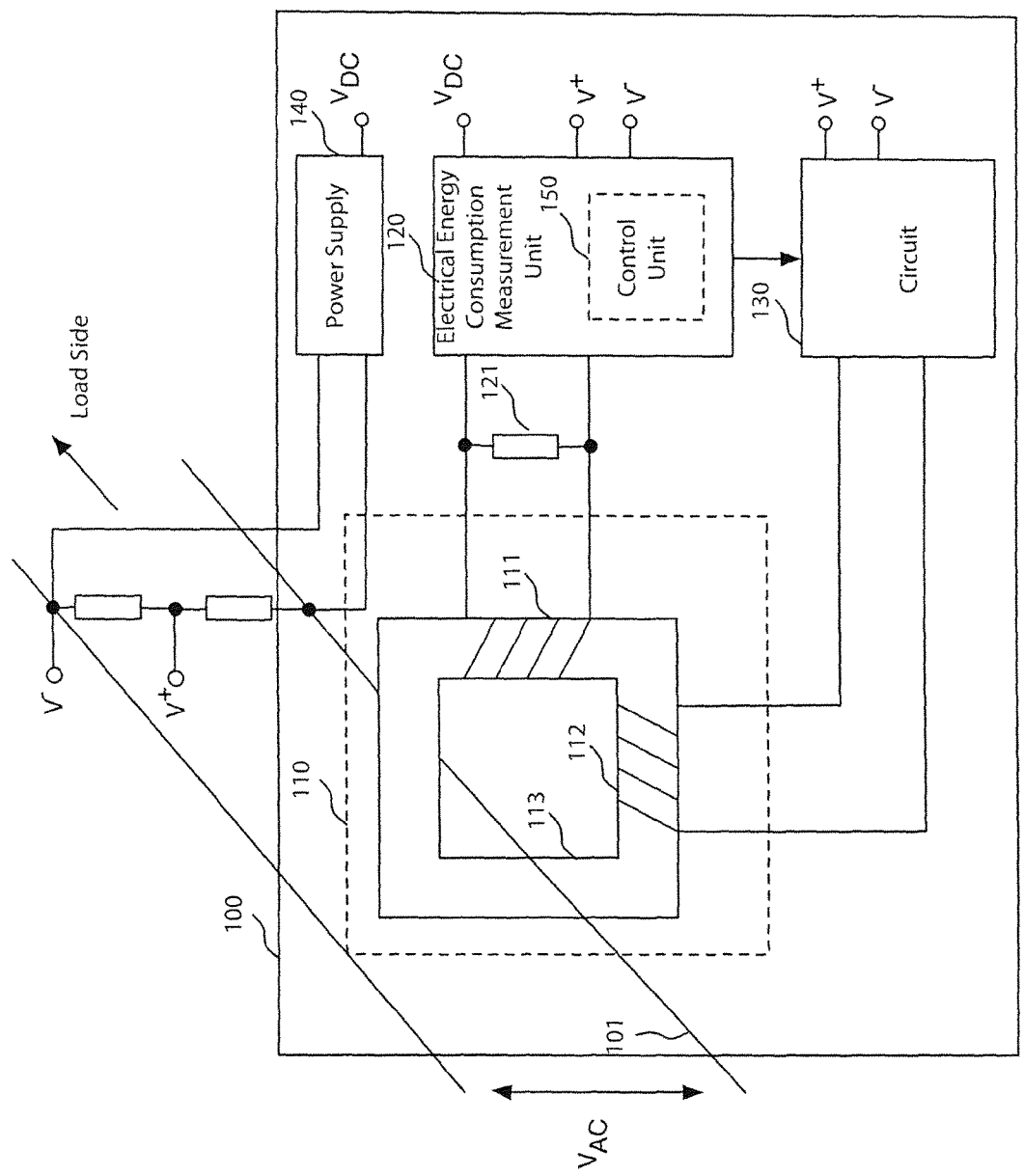
FIG. 3 illustrates a schematic block diagram of a further embodiment of an electricity meter.

FIG. 3 illustrates a further embodiment of an electricity meter 100. The electricity meter 100 comprises a current transformer 110, which comprises a primary conductor 101, a secondary winding 111, an auxiliary winding 112, and a magnetic core 113. The electricity meter 100 further comprises a circuit 130, an electrical energy consumption measurement unit 120 and a control unit 150. All these features correspond to the features which have already been described above and which are referenced by the same numerals. These features of the electricity meter 100 may be configured in any of the above described manners.

The electricity meter of FIG. 3 further comprises a power supply which is coupled to the AC supply voltage and outputs a DC supply voltage. The DC supply voltage is supplied to the electrical energy consumption measurement unit.

The electricity meter further comprises a voltage divider which is coupled to the AC supply voltage and provides an adapted AC supply voltage having a reduced amplitude. The adapted AC supply voltage is provided to the electrical energy consumption measurement unit 120 and is used to meter the amount of energy withdrawn by the consumer in a manner described above. It is noted that the voltage divider may be incorporated in the electrical energy consumption measurement unit or may be provided in addition to the electrical energy consumption measurement unit. The adapted AC supply voltage may further be used to determine the first and second values, as described in detail above.

Moreover, the adapted AC supply voltage may be provided to the circuit 130, where it may be used to generate the test signal in its modulation states, as described above. It is noted that instead of providing the adapted AC supply voltage to the circuit 130, it is also possible to provide the AC supply voltage to the circuit 130 and then adapt the amplitude of the AC supply voltage in the circuit as needed for generating the test signal. As described above, the circuit 130 may comprise a variable resistor for modulating at least one of the phase or amplitude of the test signal. However, as described in detail above, the circuit 130 may also comprise other electrical circuitry suitable for generating the test signal, such as a switch and/or passive electrical components.

The electricity meter may further comprise a resistor 121 which is connected in parallel to the secondary winding. The electrical energy consumption measurement unit may thus detect the secondary current flowing through the secondary winding by measuring the voltage drop across the resistor 121. The resistor 121 may be incorporated into the electrical energy consumption measurement unit or may be provided in addition to the energy consumption measurement unit. It is noted that the current flowing through the secondary winding may also be detected by any other current detection method known to the skilled person, and that the resistor 121 may be omitted for certain current detection methods.

The electricity meter 100 may comprise a control unit 150 for controlling the modulation state of the test signal, as described in detail above. The control unit 150 may be incorporated into the electrical energy consumption measurement unit 120 or may be provided in addition to the electrical energy consumption measurement unit.

Figure 4:
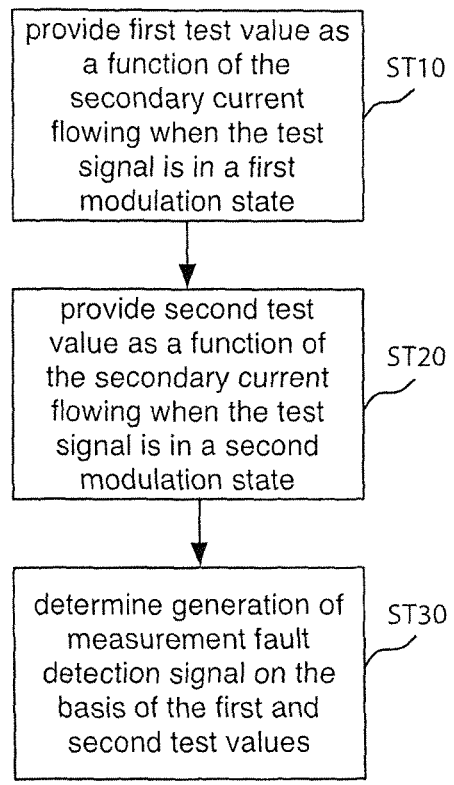
FIG. 4 illustrates a flow diagram of an embodiment of a method for detecting a fault in an electricity meter.

FIG. 4 illustrates a further embodiment of the present invention. According to this embodiment, a method of detecting a fault in an electricity meter is provided. The method comprises step ST10 of providing a first test value as a function of a secondary current flowing through the secondary winding when the auxiliary winding is provided with the test signal $V_{Test}$ in the first modulation state. The method further comprises step ST20 of providing a second test value as a function of a secondary current flowing through the secondary winding when the auxiliary winding is provided with the test signal in the second modulation state. The method further comprises step ST30 of determining, on the basis of the first and second test values, whether a measurement fault warning signal is to be generated.

Figure 5:
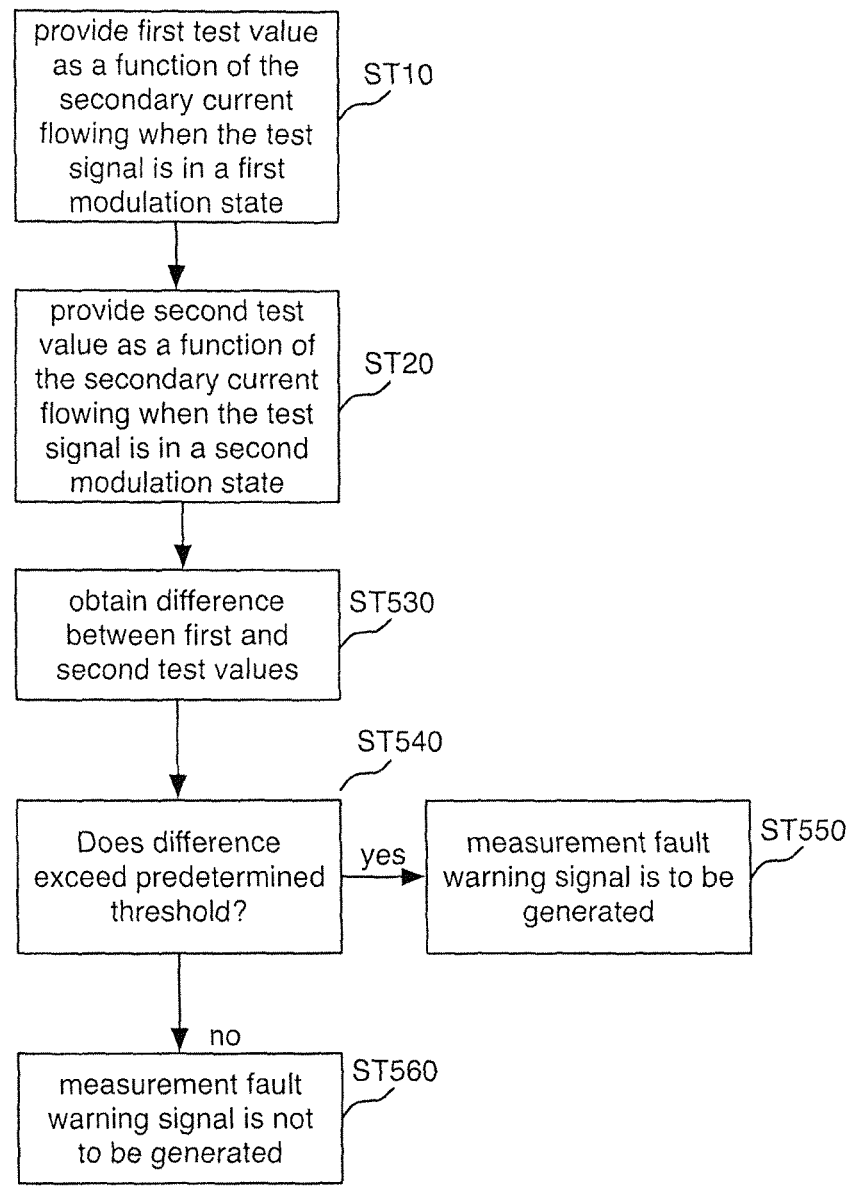
FIG. 5 illustrates a flow diagram of a further embodiment of a method for detecting a fault in an electricity meter.

FIG. 5 illustrates a further embodiment of a method of detecting a fault in an electricity meter. Steps ST10 and ST20 are the same as in the above described embodiment. In step ST530, a difference between the first and second test values is obtained. It is noted that this difference may be obtained as an absolute value. In step ST540, it is assessed, whether the difference exceeds a predetermined threshold. The predetermined threshold may be recorded in advance and may be set in between the difference between the first and second test values obtained when the magnetic core operates in the linear region and the difference between the first and second test values obtained when the magnetic core operates in the saturated region. It is noted that this threshold may also be determined as an absolute value. If it is assessed in Step ST540 that the obtained difference exceeds the predetermined threshold, it is determined in step ST550 that a measurement fault warning signal is to be generated. On the contrary, if it is assessed in step ST540 that the obtained difference does not exceed the predetermined threshold, it is determined in step ST450 that the measurement fault warning signal is not to be generated.

Figure 6:
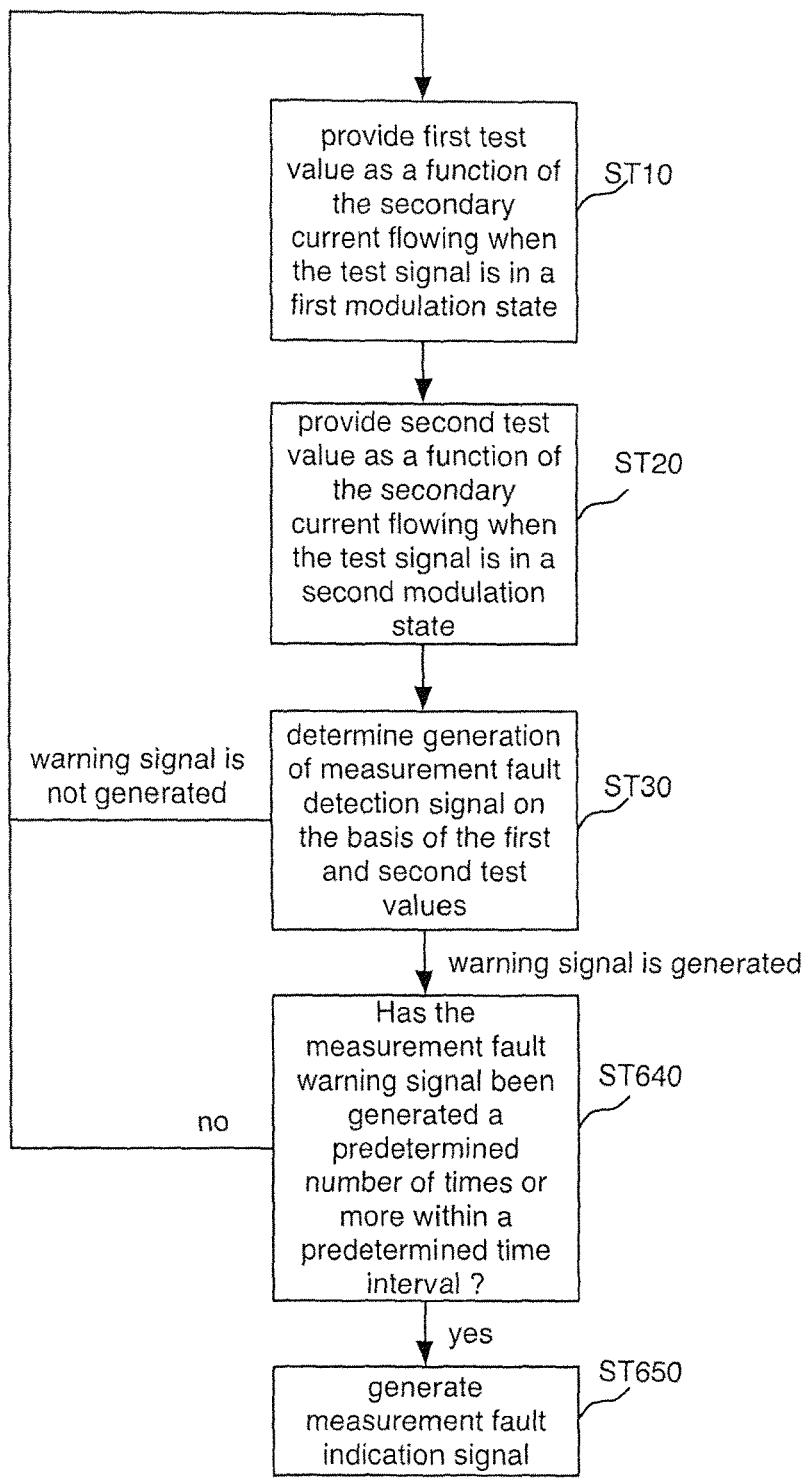
FIG. 6 illustrates a flow diagram of a further embodiment of a method for detecting a fault in an electricity meter.

FIG. 6 illustrates a further embodiment of a method of detecting a fault in an electricity meter. Steps ST10, ST20 and ST30 are the same as in the embodiment described in conjunction with FIG. 3. If it is determined in step ST30 that the measurement fault warning signal is to be generated, the method continues with step ST640 and determines whether the measurement fault warning signal has been generated a predetermined number of times or more within a predetermined time interval. If it is determined in step ST640 that the measurement fault warning signal has been generated a predetermined number of times or more within the predetermined time interval, the method continues to step ST650 and a measurement fault indication signal is generated. If it is determined in step ST640 that the measurement fault warning signal has not been generated a predetermined number of times or more, the method returns to step ST10.

In this manner, the probability may be reduced that coincidental changes in the primary AC current lead to the generation of a measurement fault indication signal.

Figure 7:
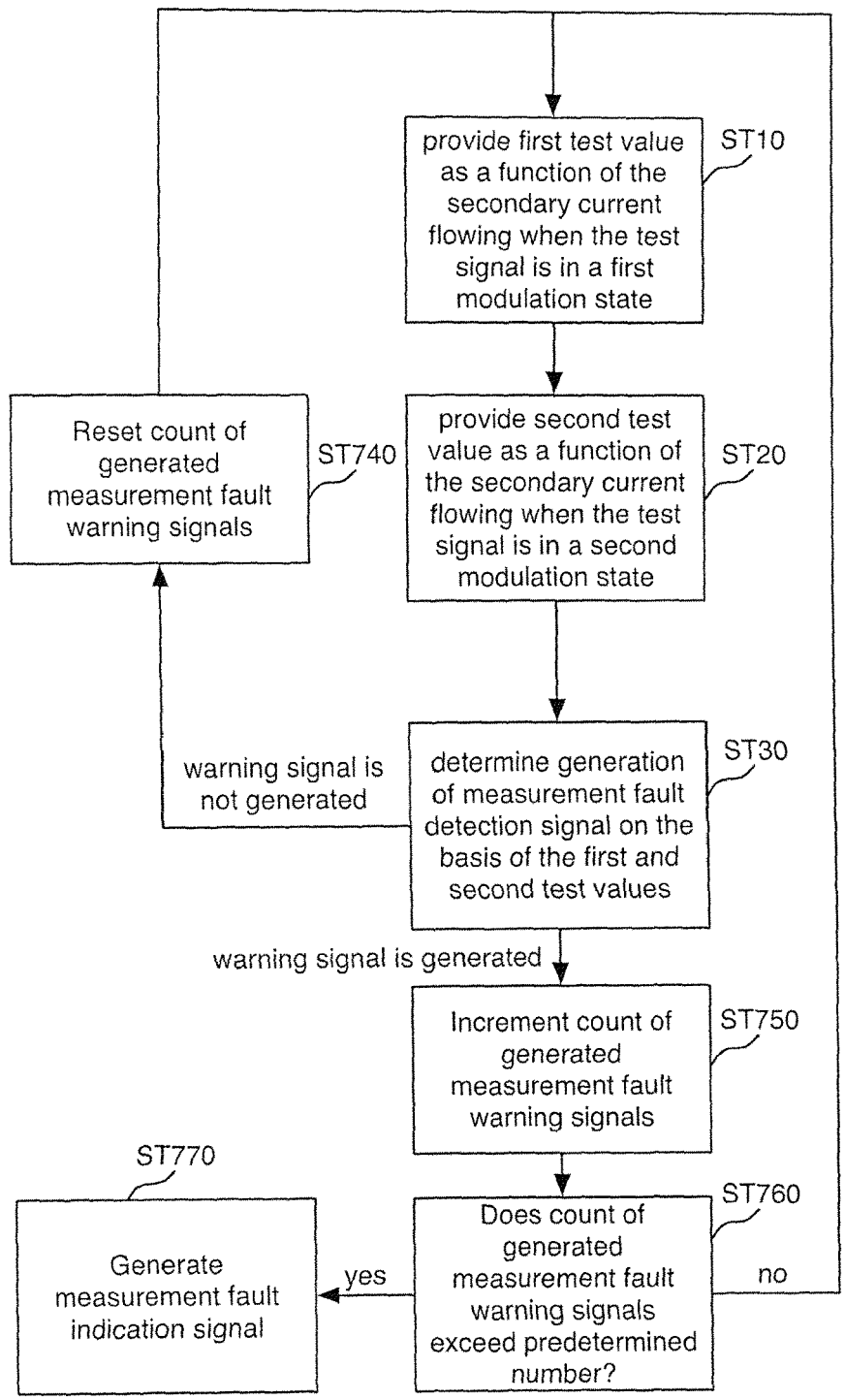
FIG. 7 illustrates a flow diagram of a further embodiment of a method for detecting a fault in an electricity meter.

FIG. 7 illustrates a further embodiment of a method of detecting a fault in an electricity meter. Steps ST10, ST20 and ST30 are the same as in the embodiment described in conjunction with FIG. 3. If it is determined in step ST30 that the measurement fault warning signal is not to be generated, the method continues with step ST740 and resets a count of generated measurement fault warning signals. On the contrary, if it is determined that the measurement fault warning signal is to be generated in step ST30, the method continues with step ST750 and increments the count of generated measurement fault warning signals. The method then proceeds to step ST760, in which it is assessed whether the count of generated measurement fault warning signals exceeds a predetermined number. If this is not the case, the method will return to step ST10. On the contrary, if the count of generated measurement fault warning signals exceeds a predetermined number, the method proceeds to step ST770 and a measurement fault indication signal is generated.

In this manner, the measurement fault indication signal is only generated if a predetermined number of successive determinations of whether the fault warning signal is to be generated have resulted in the determination that the fault warning signal is to be generated. For this reason, the probability may be reduced that coincidental changes in the primary AC current lead to the generation of a measurement fault indication signal.

In accordance with a further embodiment, an electricity meter is provided which is configured to perform any of the methods described in conjunction with FIGS. 4 to 7.

The invention claimed is:

1. An electricity meter for metering an amount of energy in accordance with a primary AC current and an AC supply voltage provided by an electrical distribution grid, the AC supply voltage having a given AC voltage frequency and the primary AC current being fed through a primary conductor, the electricity meter comprising:
a current transformer, comprising the primary conductor, a secondary winding, an auxiliary winding, and a magnetic core arranged to be magnetically coupled with the primary conductor, the secondary winding and the auxiliary winding,—
a circuit configured to provide the auxiliary winding with a test signal modulated in accordance with at least one of a first and a second modulation state, the test signal having the same frequency as the AC supply voltage;
an electrical energy consumption measurement unit coupled to the secondary winding and configured to:
provide a first test value as a function of a secondary current flowing through the secondary winding when the test signal is in a first modulation state,
provide a second test value as a function of a secondary current flowing through the secondary winding when the test signal is in a second modulation state, and
determine, on the basis of the first and second test values, whether a measurement fault warning signal is to be generated.

2. The electricity meter according to claim 1, wherein the circuit providing the test signal is configured to adapt at least one of amplitude and phase of the AC grid voltage and provide the adapted AC grid voltage as the test signal.

3. The electricity meter according to claim 1, further comprising a control unit configured to provide a control signal for the circuit to control the modulation state of the test signal.

4. The electricity meter according to claim 1, wherein the electrical consumption measurement unit is configured to determine, on the basis of a correlation between a signal that varies in accordance with the modulation states of the test signal and a set formed of the first and second test values, whether the measurement fault warning signal is to be generated.

5. The electricity meter according to claim 1, wherein the circuit is configured to provide the test signal such that the first modulation state differs from the second modulation state in at least one of an amplitude and a phase.

6. The electricity meter according to claim 1, wherein the circuit is configured to provide the test signal such that, in the first modulation state, the amplitude of the test signal is zero, and, in the second modulation state, the amplitude of the test signal is larger than zero.

7. The electricity meter according to claim 1, wherein the circuit is configured such that the phase of the test signal in the first modulation state is shifted by 180° relative to the phase of the test signal in the second modulation state.

8. The electricity meter according to claim 1, wherein the electrical energy consumption measurement unit is configured to determine whether the measurement fault warning signal is to be generated on the basis of a comparison between a difference between the first and second test values and a predetermined threshold.

9. The electricity meter according to claim 1, wherein the electrical energy consumption measurement unit is configured to determine, in accordance with the AC supply voltage, the first and second test values as energy detection values indicative of at least one of an amount of energy due to active power and an amount of energy due to reactive power, and wherein the circuit is configured to provide the test signal in at least one of the first modulation state and the second modulation state with a predetermined phase with respect to the AC supply voltage.

10. The electricity meter according to claim 9, wherein each of the first and second test values is an energy detection value indicative of an amount of energy due to active power, wherein, in the first modulation state, the amplitude of the test signal is zero, and, in the second modulation state, the amplitude of the test signal is larger than zero, and wherein a predetermined phase shift between the test signal in the second modulation state and the AC supply voltage is 90°.

11. The electricity meter according to claim 10, wherein the second time interval directly precedes or follows the first time interval.

12. The electricity meter according to claim 1, wherein the electrical energy measurement unit is configured to generate a pulse signal, the pulse frequency of the pulse signal being indicative of at least one of active power and reactive power determined as a function of the secondary current.

13. The electricity meter according to claim 12, wherein the measurement unit is configured to provide, as the first test value, a first time interval between a first pair of successive pulses of the pulse signal, and to provide, as the second test value, a second time interval between a second pair of successive pulses.

14. The electricity meter according to claim 12, wherein the electrical energy consumption measurement unit is configured to determine the first and second test values as numbers of pulses of the pulse signal registered during first and second accumulation time intervals, respectively.

15. The electricity meter according to claim 14, wherein the length of the first and second accumulation time intervals is 24 hours or more.

16. The electricity meter according to claim 14, wherein the electrical energy consumption measurement unit comprises an acquisition unit, configured to acquire a power consumption over time profile, the electrical energy consumption measurement unit being configured to set the length of the first and second accumulation time intervals on the basis of the acquired power consumption over time profile.

17. The electricity meter according to claim 1, wherein the electrical energy consumption measurement unit is configured to provide the first test value as a function of the secondary current flowing in a first test interval, and provide the second test value as a function of the secondary current flowing in a second test interval, and set the first and second test intervals to predetermined times of day.

18. The electricity meter according to claim 17, wherein the electrical energy consumption measurement unit comprises an acquisition unit, configured to acquire a power consumption over time profile, the measurement unit being configured to set the predetermined times of day on the basis of the acquired power consumption over time profile.

19. The electricity meter according to claim 1, wherein the electrical energy consumption measurement unit is configured to generate a measurement fault indication signal in response to a generated measurement fault warning signal.

20. The electricity meter according to claim 19, wherein the electrical energy consumption measurement unit is configured to generate the measurement fault indication signal if a predetermined number of successive determinations of whether the fault warning signal is to be generated have resulted in the determination that the fault warning signal is to be generated.

21. The electricity meter according to claim 19, wherein the electrical energy consumption measurement unit is configured to generate the measurement fault indication signal if, within a predetermined time interval, a predetermined number of determinations of whether the fault warning signal is to be generated have resulted in the determination that the fault warning signal is to be generated.

22. The electricity meter according to claim 19, wherein the electrical energy consumption measurement unit is configured to generate the measurement fault indication signal if, among a first predetermined number of determinations of whether the fault warning signal is to be generated, a second predetermined number of the determinations have resulted in the determination that the fault warning signal is to be generated.

23. The electricity meter according to claim 1, wherein the electrical energy consumption measurement unit is configured to determine, on the basis of the first and second test values, whether the magnetic core is saturated.

24. A method of detecting a fault in an electricity meter for metering an amount of energy in accordance with a primary AC current and an AC supply voltage provided by an electrical distribution grid, the AC supply voltage having a given AC voltage frequency and the primary AC current being fed through a primary conductor, wherein the electricity meter comprises:
   a current transformer comprising the primary conductor, a secondary winding, an auxiliary winding, and a magnetic core arranged to be magnetically coupled with the primary conductor, the secondary winding and the auxiliary winding, and
   a circuit configured to provide the auxiliary winding with a test signal modulated in accordance with at least one of a first and a second modulation state, the test signal having the same frequency as the AC voltage;
wherein the method comprises the steps of:
   providing a first test value as a function of a secondary current flowing through the secondary winding when the test signal is in the first modulation state,
   providing a second test value as a function of a secondary current flowing through the secondary winding when the test signal is in the second modulation state, and
   determining, on the basis of the first and second test values, whether a measurement fault warning signal is to be generated.

25. The method according to claim 24, further comprising determining, on the basis of the first and second test values, whether the magnetic core is saturated.

* * * * *